United States Patent
Mori

[19]

[11] Patent Number: 6,097,621
[45] Date of Patent: Aug. 1, 2000

[54] MEMORY CELL ARRAY ARCHITECTURE FOR RANDOM ACCESS MEMORY DEVICE

[75] Inventor: Kazuya Mori, Dallas, Tex.

[73] Assignee: Texas Instruments Incorporated, Dallas, Tex.

[21] Appl. No.: 09/302,645

[22] Filed: May 3, 1999

Related U.S. Application Data

[60] Provisional application No. 60/084,155, May 4, 1998.

[51] Int. Cl.[7] ............................. G11C 5/06; H01L 27/108
[52] U.S. Cl. ............................. 365/63; 365/149; 257/211; 257/296
[58] Field of Search ................................ 365/51, 63, 149; 257/211, 296, 304, 311

[56] References Cited

U.S. PATENT DOCUMENTS

| | | | |
|---|---|---|---|
| 5,298,775 | 3/1994 | Ohya | 365/149 |
| 5,488,242 | 1/1996 | Sunouchi et al. | 257/301 |
| 5,508,541 | 4/1996 | Hieda et al. | 257/301 |
| 5,555,520 | 9/1996 | Sudo et al. | 365/149 |
| 5,812,443 | 9/1998 | Lee et al. | 365/149 |
| 5,955,757 | 9/1999 | Jen et al. | 365/149 |

*Primary Examiner*—Son Mai
*Attorney, Agent, or Firm*—Robby T. Holland; Carlton H. Hoel; Frederick J. Telecky, Jr.

[57] ABSTRACT

A memory cell array architecture (300) for memory cells having a $6F^2$ area, where F is a minimum feature size, is disclosed. The array architecture (300) includes active areas (302a–302n) arranged into even columns and odd columns. The active areas (302a–302n) each include a central portion (306) and are separated from one another within a column by column spacing structures (308). The active areas of even columns are offset from those of odd columns so that the central portion the even column active areas are aligned, in the row direction, with the column spacing structures of the odd columns. This arrangement allows bit line contacts (312a–312g) to be formed at the central portions with less restrictive alignment constraints. Two storage node contacts (316a–316t) are also formed to each active area (302a–302n). A novel lithography mask for improved creation of the storage node contacts is also disclosed.

20 Claims, 6 Drawing Sheets

MEMORY CELL ARRAY ARCHITECTURE FOR RANDOM ACCESS MEMORY DEVICE

This application claims priority under 35 USC §119(e)(1) of provisional application No. 60/084,155 filed May 4, 1998.

TECHNICAL FIELD

The present invention relates generally to semiconductor memory devices, and more particularly to the physical arrangement of the various features within a memory cell array of a semiconductor memory device.

BACKGROUND OF THE INVENTION

The increasing power of computing systems has resulted in the drive for memory devices of increased size and speed. At the same time, in order to manufacture such devices with increased efficiency, it is desirable to make the physical size of such memory devices as small as possible. Therefore, it is always desirable to find some way of increasing the data density (the amount of data that can be stored in a given area) of a semiconductor memory device. This holds true for "embedded" memory applications as well. Embedded applications include a memory array as but one portion of a semiconductor device that provides higher functionality. If an embedded memory core can be reduced in size, more area can be dedicated to other circuits, or the overall physical size of the device can be reduced.

Any way of reducing the physical size of a semiconductor memory device can translate directly into considerable cost savings in the manufacture of the device. Furthermore, because the majority of the area in a memory device is occupied by memory storage cells, any way of reducing the area required for a memory cells will greatly contribute to reducing the overall size of a memory device.

Memory devices are typically manufactured by depositing and patterning a series of fabrication layers. Such layers include alternating conductive and insulating layers. Each fabrication layer is usually patterned using a lithography and etch step. The lithography step involves depositing a layer of photoresist over a layer and then "developing" or "printing" a pattern within the photoresist. The pattern is typically developed by selectively exposing portions of the photoresist to some sort of radiation. The most common form of radiation, due to its cost effectiveness, is light. To generate the pattern, a photomask containing the desired pattern is situated over the photoresist, and then light is shone through the photomask to develop the pattern within the photoresist. The undeveloped portions of the photoresist are removed with a solvent, leaving the developed pattern.

The developed pattern of photoresist will then serve as an etch mask for the fabrication layer below. An etch is applied and those portions of the fabrication layer that are exposed to the etch, are removed. Those portions of the fabrication layer that are situated below the developed photoresist pattern, will be protected from the etch, and hence remain intact. In this manner structures or "features" are formed in the fabrication layer by the etch step. For example, in the event the fabrication layer is a conductive layer, the etch step can create conductive interconnects between various portions of a device. In the event the fabrication layer is an insulating layer, the etch step can create contact holes through the insulating layer to a conductive layer below. In order to reduce the overall size of a semiconductor device, efforts are continually made to create structures that have the smallest feature sizes possible. Thus, it is desirable to print photoresist patterns as small as possible with as much reliability as possible.

Feature sizes also dictate how close structures can be situated relative to one another in a semiconductor device. This limitation arises due to avoidable misalignment errors between subsequent photomasks. For example, the minimum feature size is typically given by the variable "F." In some devices, certain structures may have to be separated from one another by distance F, to ensure the device will operate properly. For example, a contact hole created by one photomask may have to be separated from an adjacent conductive line, created by a previous photomask, by the distance F. This ensures that the misalignment between the conductive line and the contact hole will not result in the contact hole exposing, and thereby creating a short to, the conductive line.

Because the variable F dictates the minimum size and separation of various structures, it is common to describe the size of device units in terms of F. For example, in some types of semiconductor memory devices, such as dynamic random access memories (DRAMs) or ferroelectric memories, memory cell area is often described in terms of the value F. In the case of such memory devices having a "folded" bit line architecture, the smallest size memory cell area is believed to be $8F^2$. In the case of such memory devices having "open" bit line architectures, the smallest memory cell size area is believed to be $6F^2$.

In addition to impacting the overall size of a semiconductor device, feature sizes also play an important part in the functionality of a semiconductor device. For example, in order to create accurate etch mask patterns from a layer of photoresist, sufficient light intensity must be applied to the photoresist to print the pattern. However, as photomasks are made for devices having increasingly smaller features sizes, it becomes more and more difficult to provide sufficient light intensity through the openings. For example, a common minimum feature size object in a semiconductor device is a contact hole. The small photomask opening used to create the contact hole may not allow enough light intensity to create an accurate etch mask. Such limitations on contact formation can produce a barrier to further decreasing the size of a semiconductor device, particularly those devices having a high number of contacts, such as DRAMs and ferroelectric memories.

While advanced lithography methods, such as electron beam lithography, can be used to create smaller feature sizes, such approaches can be more complex, require expensive equipment, and take more time than light-based lithography approaches.

Referring now to FIG. 1, a prior art open bit line DRAM array architecture is set forth. The array architecture is designated by the general reference character 100 and includes a number of memory cells, each having a $6F^2$ cell area. The top plan view is shown with portions of various structures removed to better understand their arrangement with one another. The array architecture 100 includes a number of active areas 102a–102o or "moats" formed within a monocrystalline semiconductor substrate, and separated from one another by an isolation structure 104. A number of word lines 106a–106d are arranged over the active areas 102a–102o, with two word lines being formed over each of the active areas. The word lines form the control gates for two pass transistors within each of the active areas 102a–102o. The word lines to the right of word line 106d are not shown to better illustrate the structures underneath.

In the view of FIG. 1, the horizontal direction can be considered the column direction, and the vertical direction can be considered the row direction. Thus, the active areas 102a–102o can be considered to belong to different columns within the array. For example, active areas 102d–102f are in one column, and active areas 102g–102i are in an adjacent column.

Following the deposition of one or more insulating layers, a number of bit line contacts 108a–108j are formed by a lithography and etch step. The deposition of a conductive layer is performed afterward. One bit line contact is formed to each of the active areas 102a–102o. The bit line contacts 108a–108j are ideally formed offset with respect to their respective active areas 108a–108j. For example, bit line contact 108e is shown to have a lower portion overlapping active area 102f and an upper portion overlapping that portion of the isolation structure 104 that separates active area 102f from active area 102c. Each bit line contact 108a–108j is coupled to a region that serves as a common source for the two pass transistors of its respective active area. In order to illustrate the shape of active area 102h, the bit line contact that would be connected to active area 102h is not shown in FIG. 1.

In the prior art array architecture 100, a number of bit lines 110a–110e are ideally formed over the existing structures, making contact with the bit line contacts 108a–108j. The bit lines 110a–110e are arranged generally perpendicular to the word lines 106a–106d and between the active areas 102a–102o. While bit line 110a is shown extending across the full length of the portion of the array architecture 100, right portions of the bit lines 110b–110e are not shown to illustrate the structures beneath.

The array architecture 100 further includes a collection of storage node contacts, shown as 112a–112x. The storage node contacts 112a–112x are coupled to the drains of the pass transistors formed within the active areas 102a–102o. Storage capacitors (not shown in FIG. 1) can be formed, with one being coupled to each of the storage node contacts 112a–112x.

In the array architecture 100 of FIG. 1, the minimum width of the active areas 102a–102o, and the minimum width of the isolation structure 104 between adjacent active areas is the minimum feature size, F. Furthermore, the minimum width of the word lines 106a–106d is also the minimum feature size F. The area of one memory cell is shown in FIG. 1 by the dashed line 114. Taking into consideration the feature sizes noted, the memory cells are shown to have an area equal to $6F^2$, as noted above.

While the array architecture 100 of FIG. 1 provides for a compact memory cell array, a drawback to the architecture is the strict alignment requirements for the bit line contacts 108a–108j with respect to the active areas 102a–102o. This alignment requirement is best understood with reference to FIG. 2. FIG. 2 is a top plan view illustrating a first active area 200a, a second active area 200b, a bit line contact 202, a first bit line 204a, and an adjacent second bit line 202b. The minimum feature size is shown as "F" in FIG. 2. In the arrangement of FIG. 2, it is intended that bit line contact 202 connect the active area 200b to the first bit line 204a.

In order to ensure that the bit line contact 202 is not erroneously connected to the active area 200a (as opposed to the intended active area 200b) a minimum distance must be maintained between the bit line contact 202 and the active area 200a. This distance is shown as d in FIG. 2. At the same time, the bit line 204a must be sufficiently far from the adjacent bit line 204b, to avoid making contact with it. The bit line contact 202 in FIG. 2, thus shows the resulting allowable range of the bit line contact. The distance d distance will be less than ½ F. Such spacing does not provide enough margin for misalignment errors, and so is not suitable for conventional manufacturing processes. Thus, the manufacturability of the $6F^2$ cell memory array set forth in FIGS. 1 and 2 is impractical.

It would be desirable to arrive at a memory array architecture having memory cells with a $6F^2$ area that do not suffer from the alignment constraints of the prior art.

SUMMARY OF THE INVENTION

According to the preferred embodiment, an array architecture for memory cells having a $6F^2$ area includes a number of active areas arranged into even columns and odd columns. The active areas within the same column are separated from one another by column isolation structures. Each active area includes a central portion for receiving a bit line contact. The active areas of even columns are offset with respect to the odd columns so that along the row direction, the central portions of even columns are aligned with the column isolation structures of odd columns. This enables the bit line contact to be formed without the restrictive alignment constraints of the prior art, as the bit line contacts are not aligned in the row direction with the active area of an adjacent column.

The manufacturability of the preferred embodiment is further improved by utilizing a mask having triangular shaped openings in the formation of storage node contacts. The triangular openings provide for greater intensity than the conventional mask approaches, thus improving the printability of the storage node contacts.

According to one aspect of the preferred embodiment the array architecture further includes word lines having a zigzag shape. Pairs of the word lines overlap the same active area in even columns and different active areas in odd columns.

An advantage of the preferred embodiment is that it provides an array architecture having memory cells with a $6F^2$ area of improved manufacturability, that does not require specialized lithography systems, such as electron beam systems or the like.

DETAILED DESCRIPTION OF THE EMBODIMENTS

The preferred embodiment is an array architecture for memory cells having a $6F^2$ cell area with reduced alignment constraints, resulting in a compact array having improved manufacturability. The preferred embodiment can be implemented as an "open" bit line dynamic random access memory (DRAM) array or a ferroelectric memory array, to name just two examples. By utilizing "zig-zag" word lines and active area spaces aligned with bit line contacts, the preferred embodiment allows for greater latitude in the placement of bit line contacts, thus removing a critical constraint present in other arrays employing $6F^2$ cell area memory cells.

Figure 3:
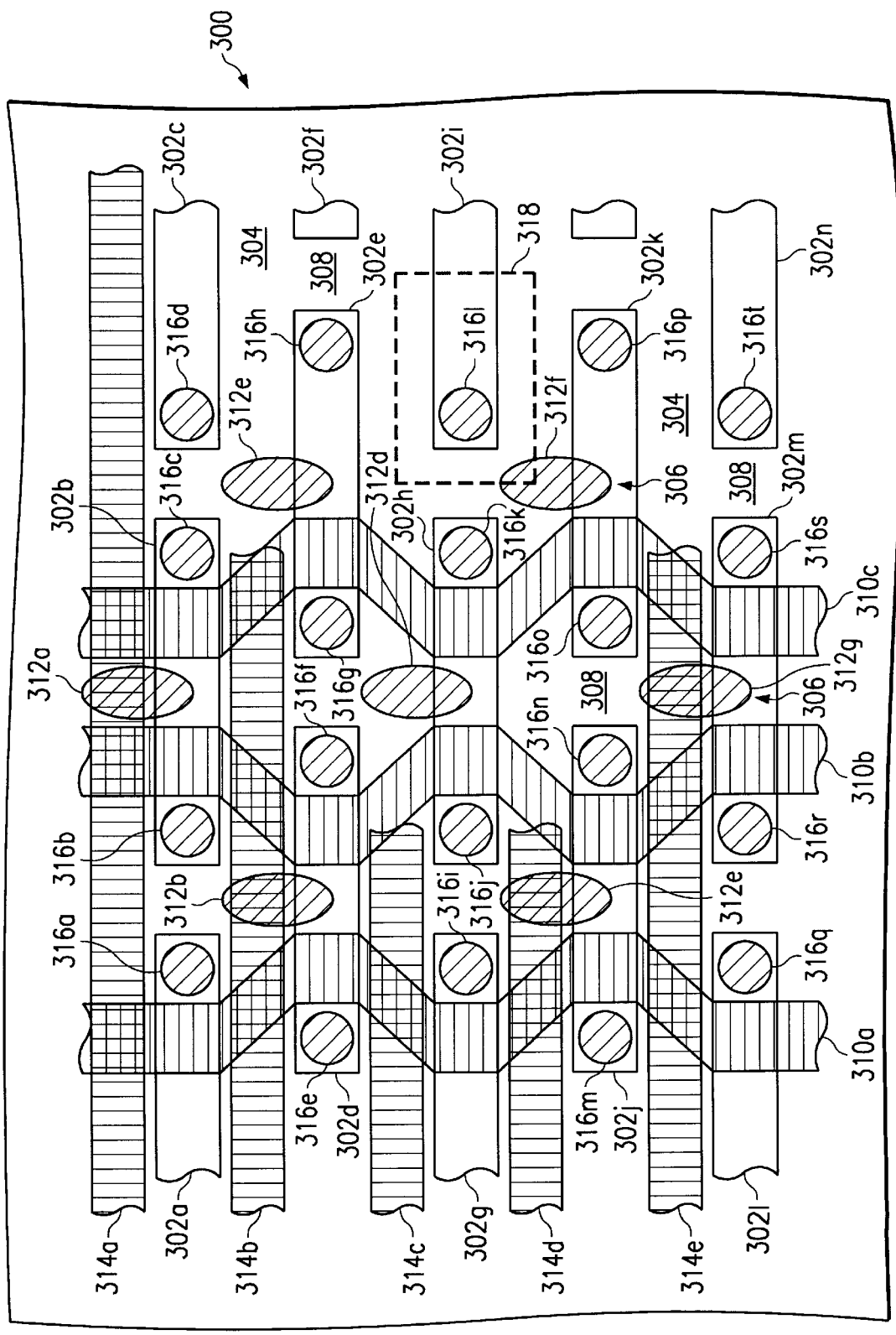
FIG. 3 is a top plan view of an array architecture of the preferred embodiment.

The preferred embodiment is set forth in a top plan view of FIG. 3, and designated by the general reference character 300. In the view of FIG. 3, the horizontal direction can be considered the column direction, and the vertical direction can be considered the row direction. The array architecture includes a number of active areas 302a–302n formed in a semiconductor substrate. The active areas 302a–302n are separated from one another by isolation structure 304. The portions of the isolation structure 304 between active areas 302a–302n in the same column can be considered column isolation structures.

Figure 1:
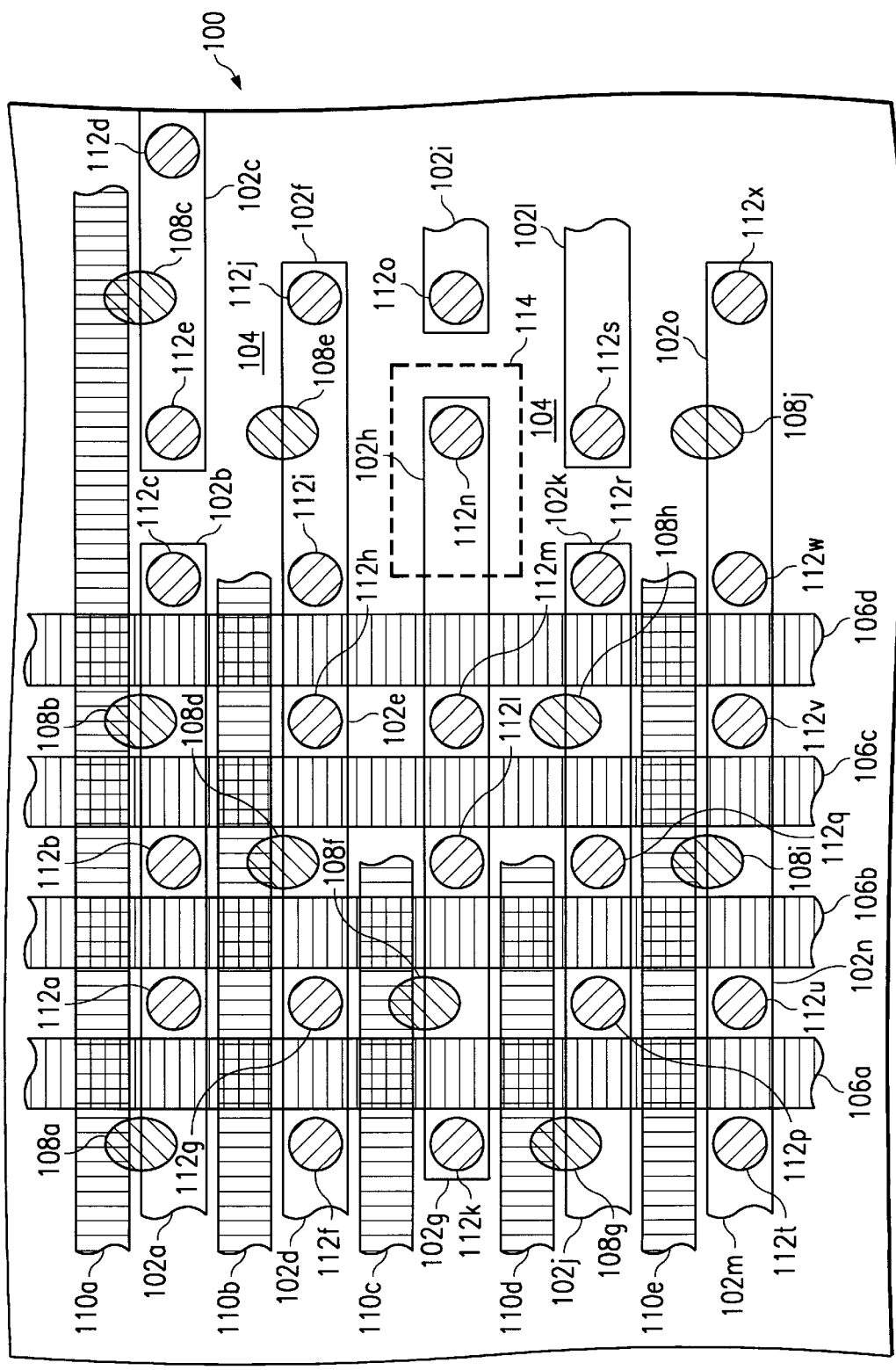
FIG. 1 is a top plan view of a prior art array architecture.

The active areas 302a–302n of the preferred embodiment 300 are arranged in a different fashion than those of the prior art example in FIG. 1. The difference can be understood by comparing how active areas of adjacent columns are offset from one another. This comparison can be understood by first considering the total distance between the left edge of one active area, and the corresponding left edge of an adjacent active area within the same column. If this distance is considered a column-wise active area spacing,. in the prior art example of FIG. 1, the active areas of one column are offset from those of an adjacent column by about one third of the active area spacing. The resulting arrangement has the bit line contact of one active area (108h for example) being aligned in the row direction, with the storage node contact (112m) of an active area (102h) in an adjacent column.

In contrast, in the preferred embodiment 300, the active areas of one column are offset from the active areas of an adjacent column by approximately one half the column-wise active area spacing. The resulting structure has the central portion of one active area being aligned in the row direction with the column isolation structures of the adjacent columns. For example, in FIG. 3, the central portion 306 of active area 302m is aligned with the column isolation structure 308 in the row-wise direction.

The preferred embodiment 300 further includes a number of word lines 310a–310c formed over the active areas 302a–302n. Two word lines overlap each active area to form the control gates of two pass transistors. Unlike the prior art arrangement of FIG. 1, in the preferred embodiment, the word lines 310a–310c have a "zigzag" shape. For example, as shown in FIG. 3, word line 310b extends across a left portion of active area 302m, in the row direction. The word line 310b changes direction ("zigs") to overlap a right portion of active area 302j, in the adjacent column. The word line 310b continues in the row direction, changing course once more ("zags") to overlap the right portion of active area 302h. The zigzag arrangement continues in this manner across the array architecture 300, zigzagging between left and right portions of active areas in adjacent columns. If the word lines are considered as adjacent word lines pairs, using 310b and 310c as an example, word line 310b would overlap the left portion of active areas in even columns and the right portion of active areas in odd columns. Word line 310c would overlap the right portion of even columns and the left portion of odd columns.

It is noted that in the view of FIG. 3, the word lines that would appear to the right of word line 310c are not shown to better illustrate the structures underneath.

It is further noted that adjacent word line pairs alternately converge toward, and diverge away, from one another, so that the word line pairs overlap the same active area in one column and then different active areas in the adjacent columns. This is best shown by the word line pair 310b and 310c in FIG. 3. The word lines of pair 310b/310c converge toward each other and overlap active area 302m (of a first column). The word lines 310b and 310c then diverge from one another, and then overlap active areas 302j and 302k, respectively (of an adjacent column). An alternate way of conceptualizing the word line pairs is to first consider the columns of the array architecture to include even columns and odd columns. A word line pair could be considered as overlapping the same active area in even columns and different active areas in odd columns.

The preferred embodiment 300 includes a number of bit line contacts 312a–312g, one bit line contact corresponding to each active area. The bit line contacts 312a–312g each overlap the central portion of their respective active area. For example, bit line contact 312g overlaps the central portion 306 of active area 302m, extending toward the adjacent column containing active areas 302j and 302k. It is understood that the bit line contacts 312a–312g are formed through an insulating layer to provide a conductive connection between the active areas 302a–302n and bit line lines.

Due to the offset of even columns with respect to odd columns, the bit line contacts of even columns (312a, 312d and 312g, for example) are shown to be generally aligned with one another in the row direction. Similarly, the bit line contacts of odd columns (312b and 312e, for example) are shown to be generally aligned with one another in the row direction. These "rows" of bit line contacts (i.e., bit line contacts aligned with one another in the row direction) are separated from one another by isolation structures. As will be described below, this arrangement provides for less restrictive alignment requirements for the bit line contacts.

The bit lines are shown as items 314a–314e, and extend in the column direction across the array architecture 300. Each bit line 314a–314e makes contact with the bit line contacts of a column. For example, bit line 314a is shown coupled to bit line contact 312a, and it is understood that bit line 314a is also coupled to bit line contacts associated with active areas 302a and 302c. Right portions of bit lines 314b–314e are not shown in FIG. 3 to better show the structures below.

Referring yet again to FIG. 3, storage node contacts 316a–316t are formed coupled to the active areas. As in the case of the bit line contacts 312a–312g, it is understood that the storage node contacts extend through insulating layers to make contact with the active areas 302a–302n. In the preferred embodiment 300, two storage node contacts are coupled to each active area. For example, as set forth in FIG. 3, storage node contacts 316b and 316c are coupled to a left portion and right portion, respectively, of active area 302b.

FIG. 3 also includes a cell boundary indication 318 which defines the area limits of a memory cell within the preferred embodiment array architecture 300. Given a minimum feature size equal to F, the area of the memory cell is shown to be $6F^2$.

An alternate way of conceptualizing the array architecture of the preferred embodiment is to consider the word lines with respect to the storage node contacts 316a–316t. The storage node contacts of even columns can be considered as aligned with one another in the row direction (e.g., storage node contacts 316b, 316j, and 316r are aligned with one another) and the storage node contacts of odd columns can be considered as being aligned with one another in the row direction (e.g., storage node contacts 316f and 316n are aligned with one another). At the same time, the storage node contacts of even columns are offset from those in the odd columns. The word lines 310a–310c can be considered to have a serpentine shape that weaves between the even column storage node contacts and the odd column storage node contacts, in the word line direction.

Figure 4:
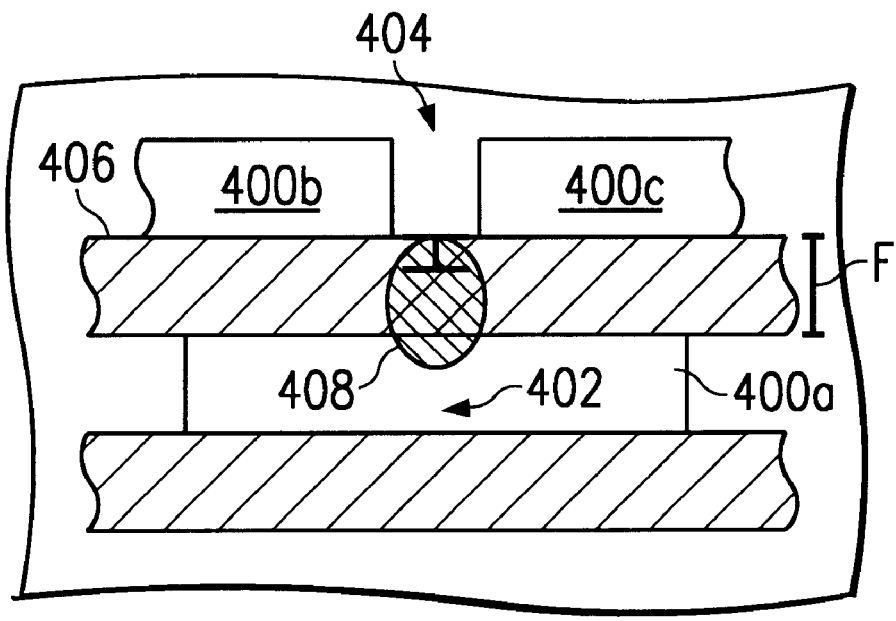
FIG. 4 is a top plan view illustrating the reduced alignment constraints of the preferred embodiment.

The placement of the active areas 302a–302n and zigzag arrangement of the word lines 310a–310c in the preferred embodiment, provides for greater flexibility in the alignment of the bit line contacts 312a–312g. This is best understood with reference to FIG. 4. FIG. 4 is a top plan view illustrating a first active area 400a of first column, and a second and third active areas (400b and 400c) of a second, adjacent column. The active areas 400a–400c are offset with respect to one another as described above. A central portion 402 of active area 400a is aligned with a column isolation structure 404 that separates active area 400b from active area 400c. A bit line 406 runs between the active areas in a column direction. The bit line 406 is connected to active area 400a by a bit line contact 408. It is understood that bit line contact 408 illustrates the allowable range of the bit line contact position.

Figure 2:
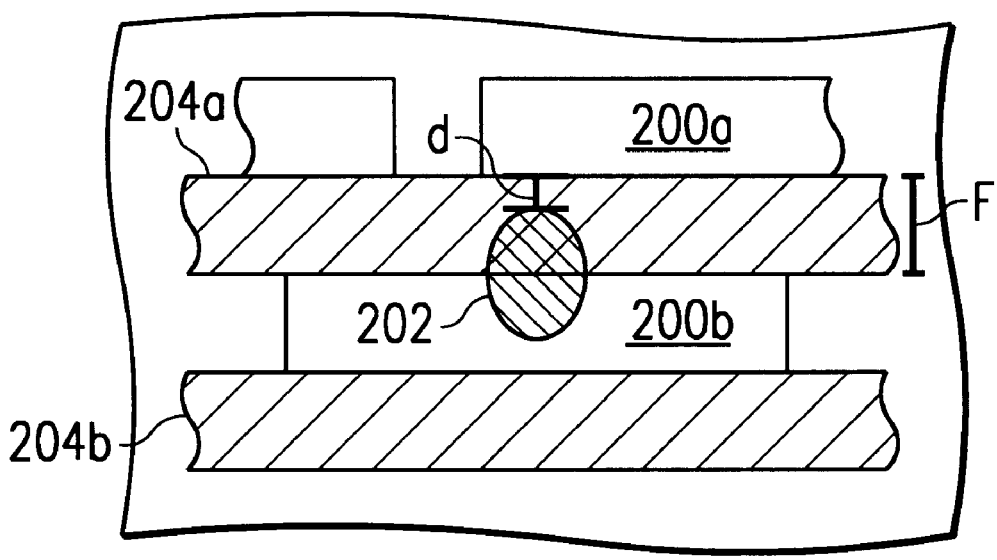
FIG. 2 is top plan view illustrating the alignment constraints of the prior art array architecture set forth in FIG. 1.

If the preferred embodiment arrangement of FIG. 4 is compared with that of FIG. 2, it is shown that by offsetting the active areas so that the central portion 402 is aligned, in the row direction, with the column isolation structure 404, greater tolerance in the alignment of the bit line contact 408 results. The bit line contact 408 could be misaligned so as to be offset toward the second column, but would only encroach on the column isolation structure 404, and not an active area. As a result, the alignment requirements for the bit line contact are less restrictive. This is best illustrated by noting that the prior art arrangement requires the d spacing between the edge of the active area 200a (also the edge of the bit line 204a) and the edge of the bit line contact 202. In contrast, the bit line contact 408 of the preferred embodiment is shown in FIG. 4, to be able to extend to the edge of the bit line 406 (also the edge of the column isolation structure 404). Thus, the preferred embodiment array architecture is freed from the restrictive bit line contact layout constraints of the prior art, and hence is more manufacturable.

While the preferred embodiment set forth in FIGS. 3 and 4 provides an array architecture for $6F^2$ area memory cells that overcomes prior art alignment constraints, the manufacturability of the array architecture can also benefit from a novel approach to forming the storage node contacts (shown as items 316a–316t in FIG. 3).

Figure 5:
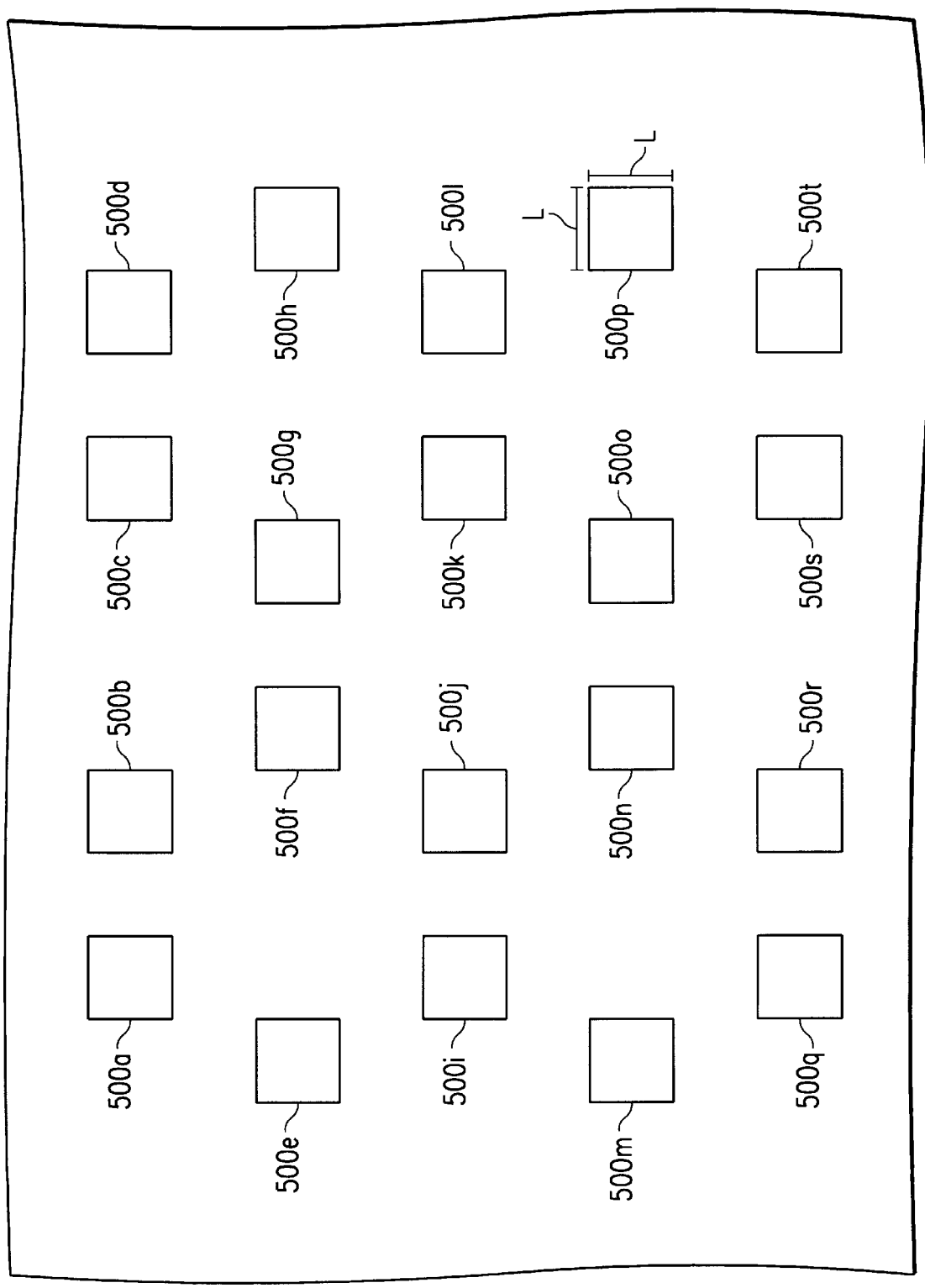
FIG. 5 is a top plan view of a conventional lithography mask that may be used in the preferred embodiment.

Referring now to FIG. 5 a top plan view is set forth illustrating a mask for forming the storage node contacts 316a–316t in the array architecture of FIG. 3. The mask of FIG. 5 may serve as a photomask for creating a storage node etch mask of photoresist. The storage node etch mask would define the extents of storage node contact holes in the preferred embodiment array architecture. FIG. 5 sets forth a conventional approach to forming the storage node contact mask. In the conventional approach, each of the contact holes is defined by a square opening 500a–500t. Each side of the square openings 500a–500t is equal to the minimum mask feature size L. The minimum mask feature size L ideally results in the printing of an etch mask feature of size F (i.e., the photomask features are "de-magnified" by lithography equipment to form the corresponding pattern in the photoresist). A comparison between the mask pattern set forth in FIG. 5 with the array architecture 300 of FIG. 3, shows the relative arrangement of the mask openings 500a–500t correspond to the relative arrangement of the storage node contacts 316a–316t.

A drawback to the conventional approach to forming the storage node contact etch mask pattern is that as the mask feature size L continues to shrink, the amount of light intensity provided to the photoresist, and hence the printability of minimum F features sizes, is reduced.

Figure 6:
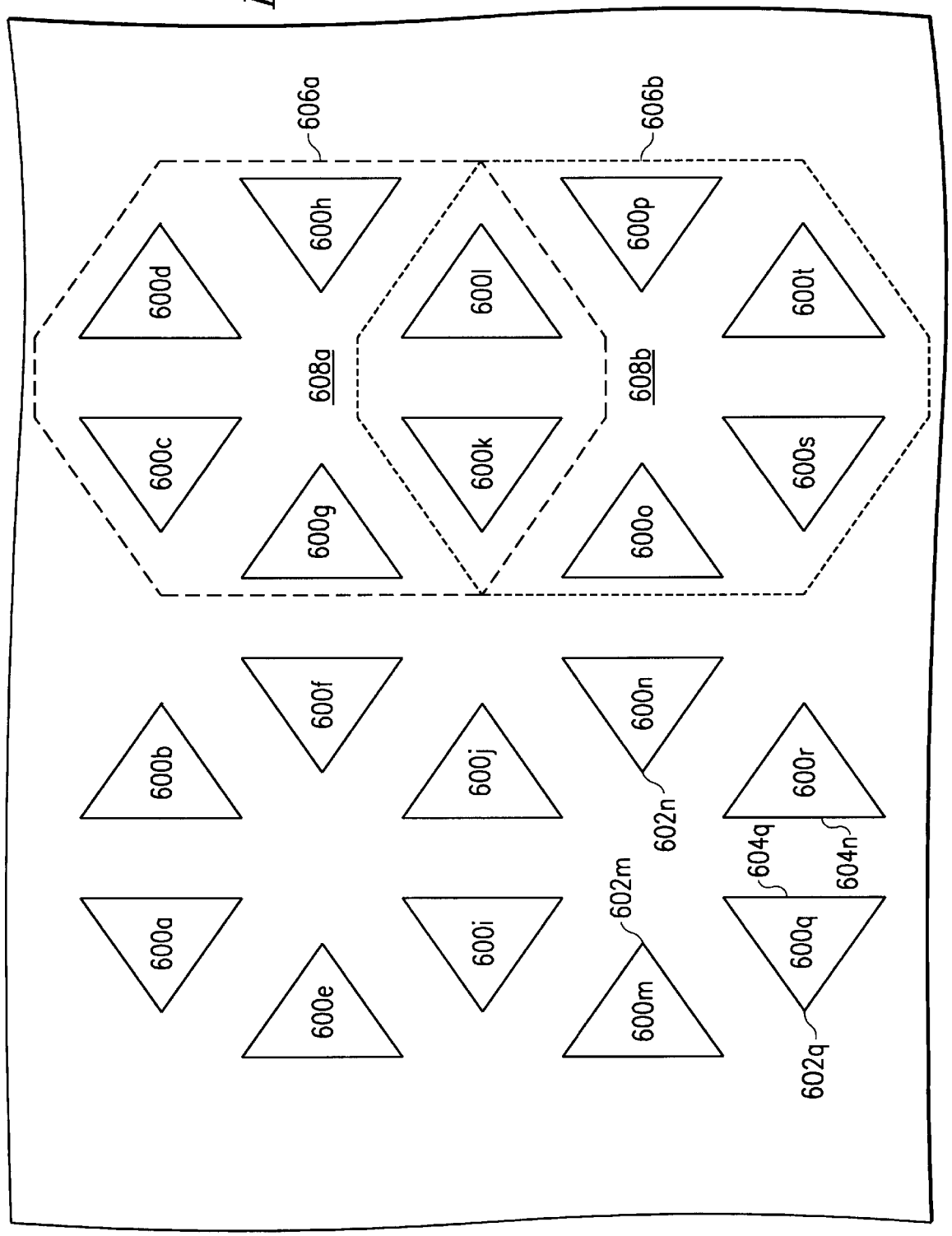
FIG. 6 is a top plan view of a novel lithography mask that may be used in the preferred embodiment.

Referring now to FIG. 6, a novel mask is set forth for providing higher intensity light to print pattern within a layer of photoresist. The novel mask includes a number of mask openings 600a–600t. Unlike the conventional mask of FIG. 5, the mask openings in the novel mask are triangular in shape, and not squares of minimum feature size. Thus, each triangular mask openings includes three sides and three vertices.

The mask set forth in FIG. 6 may be used to generate the storage node contacts 316a–316t of the preferred embodiment array architecture 300. A comparison between the mask pattern set forth in FIG. 6 with the array architecture 300 of FIG. 3, shows the relative arrangement of the mask openings 600a–600t correspond to the relative arrangement of the storage node contacts 316a–316t. Accordingly, it is noted that in FIG. 6, the horizontal direction can be considered a column direction and the vertical direction can be considered a row direction.

The orientation of the mask openings 600a–600t is shown to alternate every two columns. If the columns are conceptualized as being divided into even and odd columns, within a given row, the mask openings of even columns would have a vertex pointing in one column direction, while the mask opening of odd columns would have a vertex pointing in a second, opposite column direction. For example, in FIG. 6, if mask opening 600q is considered to be in an even column, it would include a vertex 602q, that points to the left in FIG. 6. Mask opening 600m would then be considered to be in the same row, but in an odd column, and shown to include a vertex 602m that points to the right of the figure.

Another way of conceptualizing the orientation of the mask openings 600a–600t is to consider the mask opening in terms of adjacent row pairs. Each adjacent row pair will include alternating first and second pairs of mask openings. The first pairs would include mask openings having opposing vertices, while the second pairs would include mask openings having opposing parallel sides. For example, in FIG. 6, the mask openings 600a, 600e, 600i, 600m and 600q are considered to be in one row. The other adjacent row includes mask openings 600b, 600f, 600j, 600n and 600r. Within this row pair are first pairs of mask openings 600e/600f, 600m/600n, and second pairs of mask openings 600a/600b, 600i/600j and 600q/600r. First pair 600m/600n is shown to include opposing vertices 602m and 602n, and second pair 600q/600r is shown to include opposing parallel sides 604q and 604r.

Yet another way to consider the mask opening arrangement of FIG. 6 is to conceptualize the mask openings as being grouped into interlocked hexagonal groups of six, with each group having a bit line contact area at its center. The groups are "interlocked" in the sense that two mask openings of the six within a group are shared with an adjacent group. This is best illustrated in FIG. 6, where mask openings 600c, 600d, 600g, 600h, 600k and 600l are shown as a first group 606a. A second group 606b includes mask openings 600k, 600l, 600o, 600p, 600s and 600t. The groups (606a and 606b) share mask openings 600k, 600l. The mask openings of the first group 606a surround a first bit line contact area 608a, the mask openings of the second group 606b surround a second bit line contact area 608b.

The light intensity advantages provided by the triangular mask openings of the novel mask are illustrated in FIGS.

Figure 7A:
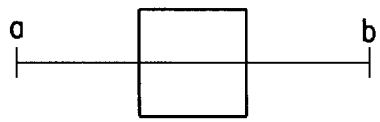
FIGS. 7A–7C provide a comparison between the lithography masks of FIG. 5 and FIG. 6.
Figure 7B:
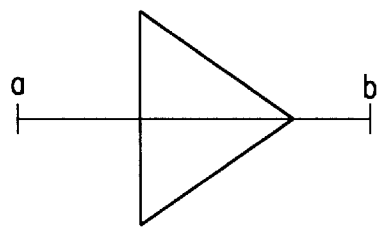
Figure 7C:
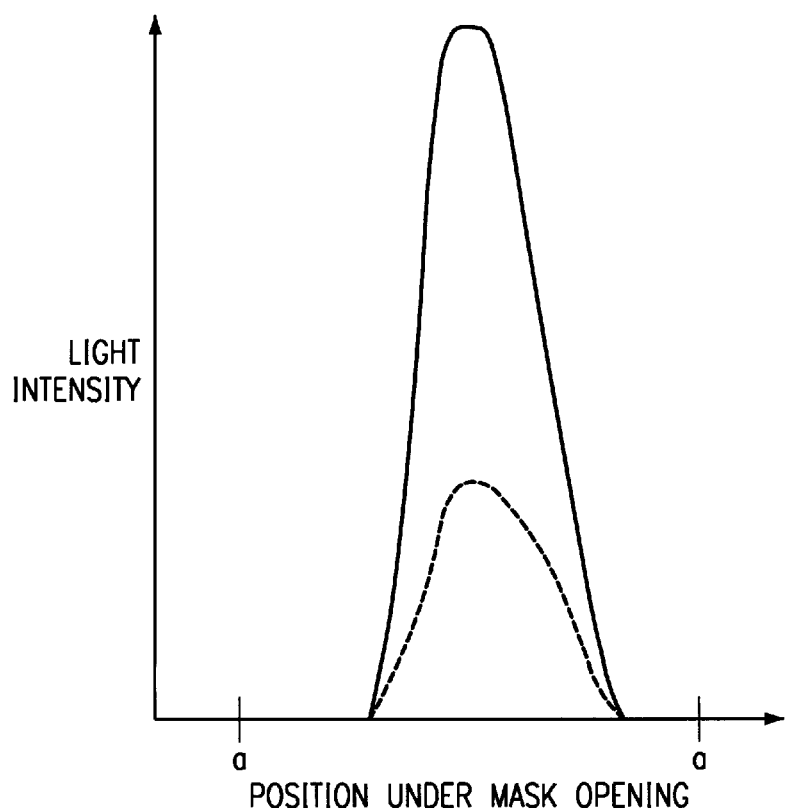

7A–7C. FIG. 7A is a top plan view of a conventional mask opening with an indicator line showing an alignment position relative to two points, point "a" and point "b." FIG. 7B is a top plan view of one of the novel mask openings, with the same indicator line, showing alignment points a and b. FIG. 7C is a graph illustrating the resulting light intensity provided by the conventional mask opening (shown as a dashed line) and the novel mask opening (shown as a solid line). The response assumes a minimum feature size of 0.16 microns, a lithography system employing a lens having a numerical aperture of 0.6, and a standard deviation of 0.3. The light source is a KrF excimer laser, and it is assumed that a phase-shifted mask is used. As shown in FIG. 7C, the novel mask opening provides approximately three times the light intensity of the conventional mask opening.

Thus, it is shown that the preferred embodiment includes an array architecture that utilizes a dense $6F^2$ cell area configuration, but without restrictive alignment constraints, nor expensive high definition lithography systems. In addition, a novel mask is shown which can further increase the manufacturability of the preferred embodiment.

It is understood that while the preferred embodiment has been discussed generally in terms of a DRAM, other types of memory devices can benefit from the teachings set forth herein. As just one example, ferroelectric memory devices having arrays with memory cell areas of $6F^2$ could be manufactured according to the teachings of the preferred embodiment.

Thus, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. In a semiconductor memory device having a feature size F, an array architecture of memory cells having an area equivalent to $6F^2$, the array architecture comprising:
   a plurality of active areas defined in a semiconductor substrate, each active area including a first portion and a second portion separated from one another by a central portion,
   the active areas being arranged in alternating even and odd columns disposed in a column direction, the active areas within each even column and odd column being separated from one another by isolation structures, the central portion of the active areas of the even columns being aligned with the isolation structures of an adjacent odd column;
   a plurality of word lines disposed in a row direction that is generally perpendicular to the column direction, the word lines being arranged in adjacent word line pairs that include a first word line and a second word line, each first word line overlapping the first portion of active areas in the even columns and the second portion of active areas in the odd column, each second word line overlapping the second portion of active areas in the even columns and the first portion of active areas in the odd columns; and
   a plurality of first contacts coupled to the central portions of the active areas.

2. The array architecture of claim 1, wherein:
   the word lines of each adjacent word line pair have a zigzag shape, the word lines of the word line pairs converging toward one another over the even columns, and diverging away from one another over the odd columns.

3. The array architecture of claim 1, wherein:
   the first contacts are bit line contacts.

4. The array architecture of claim 3, further including:
   a bit line associated with each even column and each odd column, each bit line being coupled to the bit line contacts of its associated column.

5. The array architecture of claim 1, further including:
   a plurality of second contacts,
   one of the second contacts being coupled to the first portion of each active area, and being separated from the first contact coupled to its respective active area by a word line, and
   another second contact being coupled to the second portion of each active area, and separated from the first contact coupled to its respective active area by another word line.

6. The array architecture of claim 5, wherein:
   the semiconductor memory device is a dynamic random access memory; and
   the second contacts are storage node capacitor contacts.

7. The array architecture of claim 5, wherein:
   the second contacts are formed using a mask with triangular openings.

8. The array architecture of claim 1, wherein:
   the word lines form two insulated gate field effect transistors (IGFETs) in each active area, the central portion of each active area forming a common source for the two IGFETs of the active area.

9. A semiconductor memory device memory cell array, comprising:
   a plurality of active areas being aligned with one another in a first direction to form a plurality of columns, each active area including a first portion, a second portion, and a central portion, the distance between the first portion of one active area and the first portion of an adjacent active area in the same column being an active area spacing;
   the columns include even columns and odd columns, the even columns being offset from the odd columns by approximately one-half of the active area spacing;
   a plurality of access contacts coupled to the central portions of the active areas, the access contacts of the even columns being aligned with one another in a second direction to form first rows of access contacts that are generally perpendicular to the first direction, the access contacts of the odd columns being aligned with one another in the second direction to form second rows of access contacts disposed between the first rows of access contacts, the access contacts of each first and second access contact row being separated from one another by isolation structures; and
   a plurality of word lines, each word line zigzagging between a first access contact row and an adjacent second access contact row.

10. The memory cell array of claim 9, wherein:
    the word lines are arranged into adjacent word line pairs, each word line pair overlapping the same active area in even columns and different active areas in odd columns.

11. The memory cell array of claim 9, wherein:
    each active area includes the drain of a first transistor, the drain of a second transistor, and a source common to the first and second transistors; and
    one of the word lines forms the gate of the first transistor, and another of the word lines form the gate of the second transistor.

12. The memory cell array of claim 11, wherein:

the word lines have a width equivalent to a distance F; and the first transistor is part of a first memory cell having an area equivalent to 6 $F^2$, and the second transistor is part of an adjacent second memory cell having an area equivalent to 6 $F^2$.

13. The memory cell array of claim 1, wherein:

the active areas have a width equivalent to a distance F; and the first transistor is part of a first memory cell having an area equivalent to 6 $F^2$, and the second transistor is part of an adjacent second memory cell having an area equivalent to 6 $F^2$.

14. The memory cell array of claim 9, further including:

a plurality of storage node contacts, the storage node contacts including first storage node contacts coupled to the first portion of each active area and second storage node contacts coupled to the second portion of each active area; and the word lines are arranged into adjacent word line pairs, a first word line of each word line pair further zigzagging between the first storage node contacts of even columns and the second storage node contact of odd columns, a second word line of each word line pair further zigzagging between the second storage node contacts of even columns and the first storage node contact of odd columns.

15. The memory cell array of claim 14, wherein:

the storage node contacts are formed with a lithography mask having a triangular opening corresponding to each storage node contact.

16. An array architecture for a semiconductor memory device, the array architecture comprising:

a plurality of memory cells arranged generally into adjacent row pairs and columns to form an array, each memory cell including a storage node contact; and the storage node contacts are formed with a lithography mask having a plurality of triangular mask openings, each mask opening including three sides joined at three vertices, the mask openings being arranged into adjacent row pairs corresponding to the memory cell row pairs, each row pair of mask openings including alternating first and second pairs of mask openings, the first pairs having opposing parallel sides aligned in the row direction, the second pairs having opposing vertices.

17. The array architecture of claim 16, wherein:

the sides of each mask opening are equivalent in length.

18. The array architecture of claim 16, wherein:

the memory cells further include an access contact shared by two memory cells; and the mask openings include an access contact area corresponding to the location of each access contact in the array, each access contact area being surrounded by a group of six mask openings.

19. The array architecture of claim 18, wherein:

a vertex of each mask opening in each group is pointed at its respective access contact area.

20. The array architecture of claim 16, wherein:

the mask openings are arranged into mask columns corresponding to the array columns, the mask openings of each column including adjacent mask opening column pairs, each mask opening column pair having opposing sides parallel to one another.

* * * * *